US012266627B2

(12) United States Patent
Sakai

(10) Patent No.: US 12,266,627 B2
(45) Date of Patent: Apr. 1, 2025

(54) SEMICONDUCTOR DEVICE AND METHOD FOR MANUFACTURING THE SAME

(71) Applicant: Mitsubishi Electric Corporation, Tokyo (JP)

(72) Inventor: Shinji Sakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 334 days.

(21) Appl. No.: 17/853,813

(22) Filed: Jun. 29, 2022

(65) Prior Publication Data

US 2023/0132056 A1    Apr. 27, 2023

(30) Foreign Application Priority Data

Oct. 27, 2021    (JP) .................................. 2021-175883

(51) Int. Cl.
*H01L 23/00*    (2006.01)
*H01L 21/48*    (2006.01)
*H01L 23/498*    (2006.01)

(52) U.S. Cl.
CPC .......... *H01L 24/32* (2013.01); *H01L 21/4825* (2013.01); *H01L 21/4839* (2013.01);
(Continued)

(58) Field of Classification Search
CPC .......... H01L 24/32; H01L 24/05; H01L 24/29
See application file for complete search history.

(56) References Cited

U.S. PATENT DOCUMENTS 7,663,212 B2 *  2/2010  Otremba ................. H01L 24/40
                                                          257/692
2016/0141209 A1   5/2016  Takano
(Continued)

FOREIGN PATENT DOCUMENTS

JP    61004430 U  *  1/1986
JP    S61-4430 U     1/1986
(Continued)

OTHER PUBLICATIONS

An Office Action mailed by the German Patent and Trademark Office on Jan. 15, 2025, which corresponds to German Patent Application No. 102022120253.4 and is related to U.S. Appl. No. 17/853,813; with English language translation.

*Primary Examiner* — Michele Fan
(74) *Attorney, Agent, or Firm* — Studebaker Brackett PLLC

(57) ABSTRACT

A semiconductor device includes: a die pad having a conductive property; a semiconductor chip; a back surface electrode formed on a back surface of the semiconductor chip; an Ag bonding material containing 50 to 85% Ag and bonding the back surface electrode and the die pad; a terminal connected to the semiconductor chip; and sealing resin having an insulating property and covering the die pad, the semiconductor chip, the Ag bonding material, and a part of the terminal, wherein a distal end of the terminal protruding from the sealing resin includes a substrate bonding surface, a metal burr protrudes from a peripheral portion on a lower surface of the back surface electrode contacting the Ag bonding material, and a thickness of the Ag bonding material is larger than a height in an up-down direction of the metal burr by 2 μm or more.

13 Claims, 5 Drawing Sheets

(52) U.S. Cl.
CPC .. *H01L 23/49811* (2013.01); *H01L 23/49838* (2013.01); *H01L 23/49861* (2013.01); *H01L 24/05* (2013.01); *H01L 24/29* (2013.01); *H01L 24/73* (2013.01); *H01L 24/83* (2013.01); *H01L 24/48* (2013.01); *H01L 2224/05005* (2013.01); *H01L 2224/05082* (2013.01); *H01L 2224/05124* (2013.01); *H01L 2224/05139* (2013.01); *H01L 2224/05541* (2013.01); *H01L 2224/05557* (2013.01); *H01L 2224/05573* (2013.01); *H01L 2224/05639* (2013.01); *H01L 2224/05644* (2013.01); *H01L 2224/29139* (2013.01); *H01L 2224/32013* (2013.01); *H01L 2224/32057* (2013.01); *H01L 2224/32245* (2013.01); *H01L 2224/48137* (2013.01); *H01L 2224/73265* (2013.01); *H01L 2224/8384* (2013.01); *H01L 2924/182* (2013.01); *H01L 2924/186* (2013.01); *H01L 2924/351* (2013.01)

(56) References Cited

U.S. PATENT DOCUMENTS

| | | | |
|---|---|---|---|
| 2024/0113093 A1* | 4/2024 | Arimura | H01L 24/48 |
| 2024/0312877 A1* | 9/2024 | Osumi | H01L 23/49575 |

FOREIGN PATENT DOCUMENTS

| | | |
|---|---|---|
| JP | 2005-150595 A | 6/2005 |
| JP | 2011-023631 A | 2/2011 |
| JP | 2016-103622 A | 6/2016 |
| JP | 2017-071826 A | 4/2017 |

* cited by examiner

SEMICONDUCTOR DEVICE AND METHOD FOR MANUFACTURING THE SAME

BACKGROUND OF THE INVENTION

Field

The present disclosure relates to a semiconductor device and a method for manufacturing the same.

Background

Solder has been generally used as a bonding material between a back surface electrode of a semiconductor chip and a die pad. Particularly when a substrate is mounted by reflow, a high melting point solder having a large lead content has been used (see, e.g., JP 2005-150595 A). However, even in applications requiring a high melting point solder, such as responding to substrate reflow or high reliability applications, a lead content in the solder has been increasingly regulated in consideration of the environmental impact. Sinter-bonding using an Ag paste has been applied in consideration of the environmental influence.

SUMMARY

However, there is a problem that voids are easily generated in an Ag bonding material due to thermal shrinkage and solvent volatilization. A metal burr having a substantially annular shape in a planar view protrudes from a peripheral portion of the back surface electrode of the semiconductor chip by dicing the semiconductor chip. It has been found that the metal burr prevents a volatile matter content of a solvent that has occurred in the Ag paste from being exhausted to the atmosphere. There has been a problem that the generation of the voids causes a decrease and a variation in heat dissipation.

The present disclosure has been made to solve the above-described problem, and is directed to obtaining a semiconductor device capable of improving heat dissipation and reducing a variation in heat dissipation and a method for manufacturing the same.

A semiconductor device according to the present disclosure includes: a die pad having a conductive property: a semiconductor chip; a back surface electrode formed on a back surface of the semiconductor chip: an Ag bonding material containing 50 to 85% Ag and bonding the back surface electrode and the die pad: a terminal connected to the semiconductor chip; and sealing resin having an insulating property and covering the die pad, the semiconductor chip, the Ag bonding material, and a part of the terminal, wherein a distal end of the terminal protruding from the sealing resin includes a substrate bonding surface, a metal burr protrudes from a peripheral portion on a lower surface of the back surface electrode contacting the Ag bonding material, and a thickness of the Ag bonding material is larger than a height in an up-down direction of the metal burr by 2 μm or more.

In the present disclosure, the thickness of the Ag bonding material is larger than the height in the up-down direction of the metal burr by 2 μm or more. This makes it possible to ensure a path through which voids generated by volatilization or shrinkage of solvent when the Ag paste is sintered are to be released. Accordingly, the number of voids in the Ag bonding material can be reduced. Therefore, heat dissipation can be improved, and a variation in heat dissipation can be reduced.

Other and further objects, features and advantages of the invention will appear more fully from the following description.

DESCRIPTION OF EMBODIMENTS

A semiconductor device and a method for manufacturing the same according to the embodiments of the present disclosure will be described with reference to the drawings. The same components will be denoted by the same symbols, and the repeated description thereof may be omitted.

First Embodiment

Figure 1:
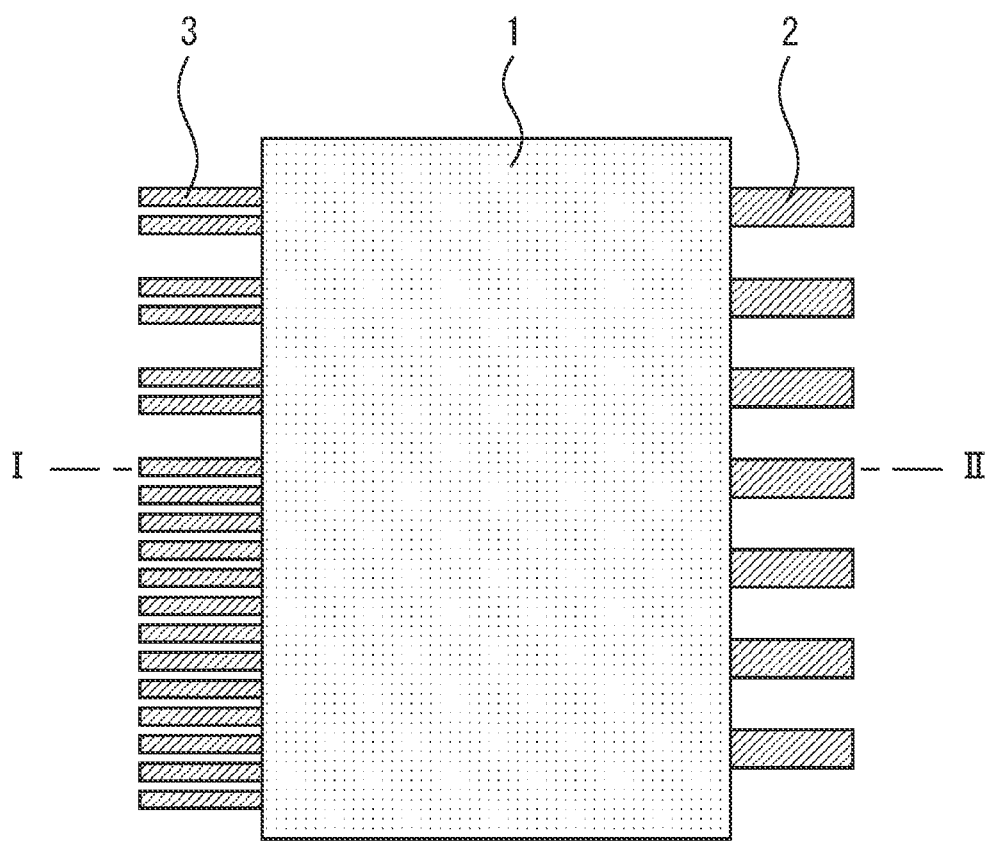
FIG. 1 is a top view illustrating a semiconductor device according to a first embodiment.

FIG. 1 is a top view illustrating a semiconductor device according to a first embodiment. A sealing resin 1 has a rectangular shape in a planar view. Terminals 2 and 3 respectively protrude from opposing long sides of the sealing resin 1.

Figure 2:
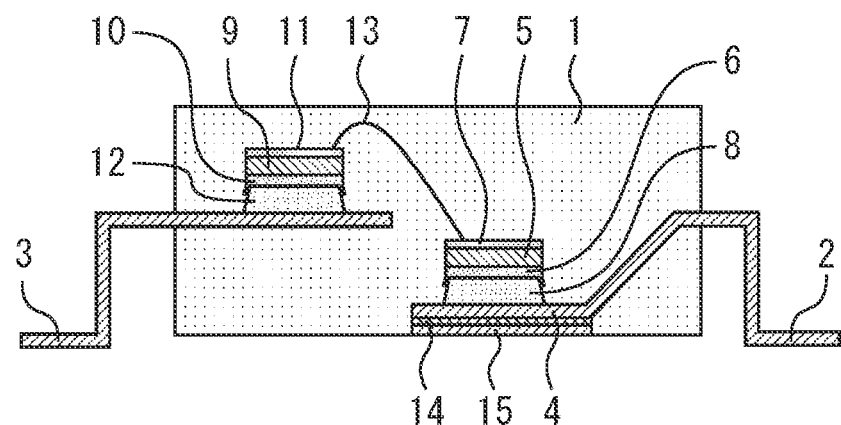
FIG. 2 is a cross-sectional view taken along a line I-II illustrated in FIG. 1.

FIG. 2 is a cross-sectional view taken along a line I-II illustrated in FIG. 1. The terminals 2 and 3 and a die pad 4 are each a lead frame having a conductive property formed of a metal such as copper. The die pad 4 and the terminal 2 are connected to each other. The terminals 2 and 3 are electrically separated from each other.

A semiconductor chip 5 is a power chip formed of Si or SiC. A back surface and a front surface of the semiconductor chip 5 are respectively provided with a back surface electrode 6 and a front surface electrode 7. An Ag bonding material 8 bonds the back surface electrode 6 of the semiconductor chip 5 and the die pad 4 to each other. The terminal 2 is connected to the semiconductor chip 5 with the die pad 4 and the Ag bonding material 8 interposed therebetween.

A semiconductor chip 9 is a control IC that controls conduction of the semiconductor chip 5. A back surface and a front surface of the semiconductor chip 9 are respectively provided with a back surface electrode 10 and a front surface electrode 11. An Ag bonding material 12 bonds the back surface electrode 10 of the semiconductor chip 9 and the terminal 3 to each other. The terminal 3 is connected to the semiconductor chip 9 with an Ag bonding material 12 interposed therebetween. The Ag bonding materials 8 and 12 each contain 50 to 85% Ag.

A wire 13 electrically connects the front surface electrode 7 of the semiconductor chip 5 and the front surface electrode 11 of the semiconductor chip 9 to each other. The wire 13 is formed of a material such as Cu, Al, or Au. The semiconductor chip 5 and an insulating layer 14 are respectively bonded to a front surface and a back surface of the die pad 4. A heat dissipation plate 15 is bonded to a back surface of the insulating layer 14. The heat dissipation plate 15 is formed of a copper material, for example.

The sealing resin 1 having an insulating property covers the die pad 4, the semiconductor chips 5 and 9, the Ag bonding materials 8 and 12, the wire 13, and respective parts of the terminals 2 and 3. A back surface of the heat dissipation plate 15 is exposed from the sealing resin 1, and releases heat generated at the time of energization of the semiconductor chip 5 to the outside. The terminals 2 and 3 protruding from a side surface of the sealing resin 1 are bent downward. Distal end portions of the terminals 2 and 3 are respectively adjusted at positions lower than the sealing resin 1, and respectively have substrate bonding portions parallel to a back surface of the sealing resin 1 or the heat dissipation plate 15. The substrate bonding portions respectively have substrate bonding surfaces, whereby a package can be surface-mounted on a substrate.

Figure 3:
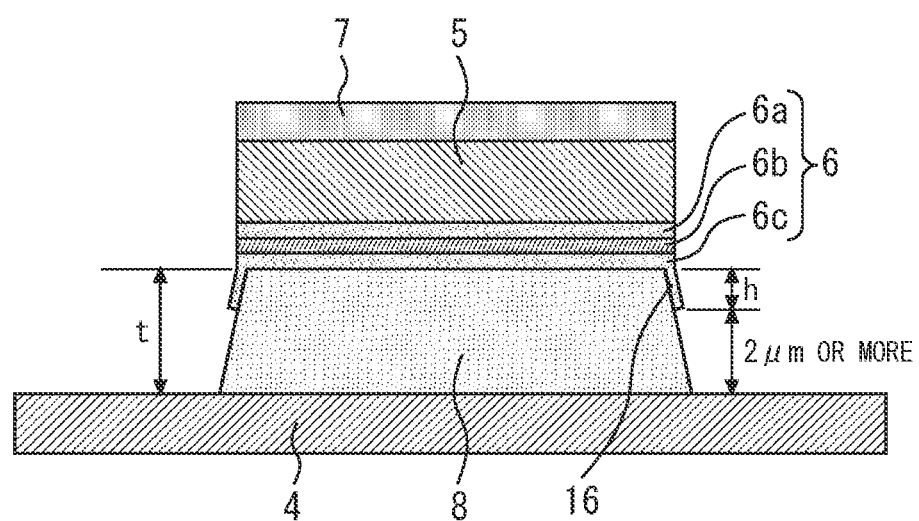
FIG. 3 is a cross-sectional view illustrating a semiconductor chip in the semiconductor device according to the first embodiment in an enlarged manner.

FIG. 3 is a cross-sectional view illustrating a semiconductor chip in the semiconductor device according to the first embodiment in an enlarged manner. The back surface electrode 6 includes an ohmic electrode 6a, an adhesive layer 6b, and an oxidation prevention electrode 6c that have been stacked in this order from the semiconductor chip 5 side. The ohmic electrode 6a is ohmic-bonded to the semiconductor chip 5. The oxidation prevention electrode 6c on an uppermost surface of the back surface electrode 6 contacts the Ag bonding material 8. A metal burr 16 having a substantially annular shape in a planar view protrudes downward from a peripheral portion on a lower surface of the back surface electrode 6. A thickness t of the Ag bonding material 8 is larger than a height h in an up-down direction of the metal burr 16 by 2 μm or more.

Figure 4:
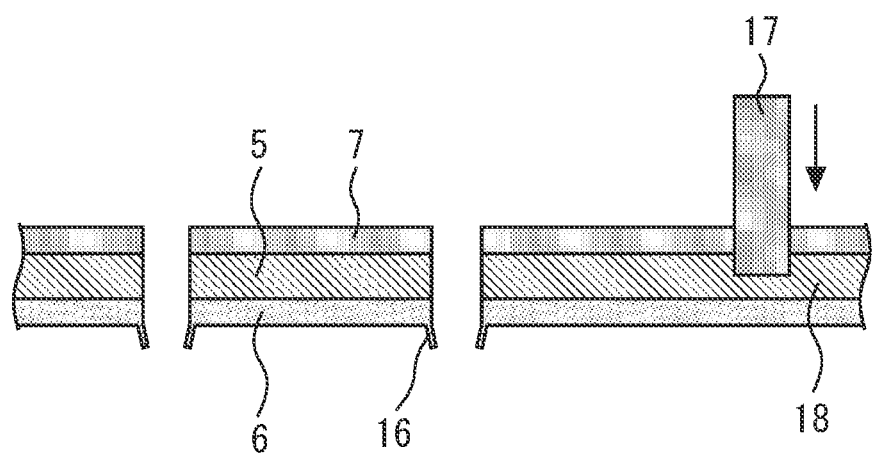
FIG. 4 is a cross-sectional view illustrating the method for manufacturing the semiconductor device according to the first embodiment.
Figure 5:
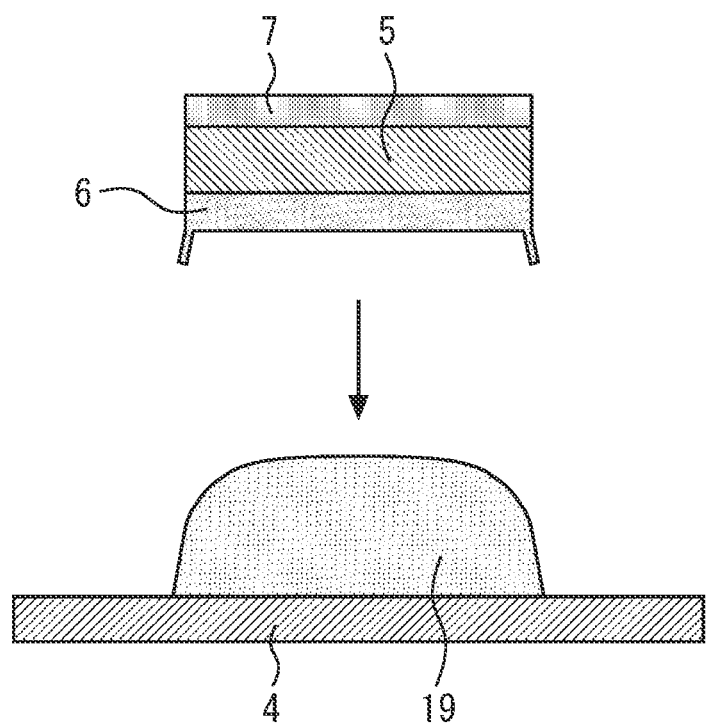
FIG. 5 is a cross-sectional view illustrating the method for manufacturing the semiconductor device according to the first embodiment.

Then, a method for manufacturing the semiconductor device according to the present embodiment will be described. FIGS. 4 and 5 are cross-sectional views each illustrating the method for manufacturing the semiconductor device according to the first embodiment. First, a semiconductor wafer 18 is diced using a dicing blade 17 and is divided into semiconductor chips 5, as illustrated in FIG. 4. In this case, the back surface electrode 6 is deformed due to a high temperature into the metal burr 16.

Then, an Ag paste 19 is applied onto the die pad 4 having a conductive property, as illustrated in FIG. 5. The semiconductor chip 5 having the back surface electrode 6 is placed on the Ag paste 19. The Ag paste 19 is heated at 200° C. for approximately two hours, to sinter-bond the die pad 4 and the back surface electrode 6 to each other. The Ag paste 19 after sintering is the Ag bonding material 8. The thickness of the Ag paste 19 to be applied onto the die pad 4 is set such that the thickness of the Ag bonding material 8 after the sintering is larger than the height in the up-down direction of the metal burr 16 by 2 μm or more.

The viscosity of the Ag paste 19 before the sintering is preferably 20 Pa·S or more and more preferably approximately 25 Pa·S. When the Ag paste 19 having a high viscosity is thus used, the Ag paste 19 can be made thick in a small amount. A supply amount of the Ag paste 19 can be reduced. This makes it possible to prevent the Ag paste 19 from being scattered, prevent the Ag paste 19 from wrapping around the front surface of the semiconductor chip 5, or prevent the Ag paste 19 from wrapping around the back surface of the die pad 4 due to excessive supply of the Ag paste 19, to avoid an inclination of the semiconductor chip 5, for example. An upper limit value of the thickness of the Ag paste 19 is determined depending on the height of the package, the area of the die pad 4, the viscosity of the paste, the accuracy of the inclination of the semiconductor chip 5, or the like.

Although the Ag paste 19 has an Ag content of 85% or less after the sintering because it contains a solvent, an Ag bonding material that is not a paste has an Ag content of 85% or more. The Ag bonding material that is not a paste is outside the target of the present disclosure because there is no problem of voids when used.

Figure 6:
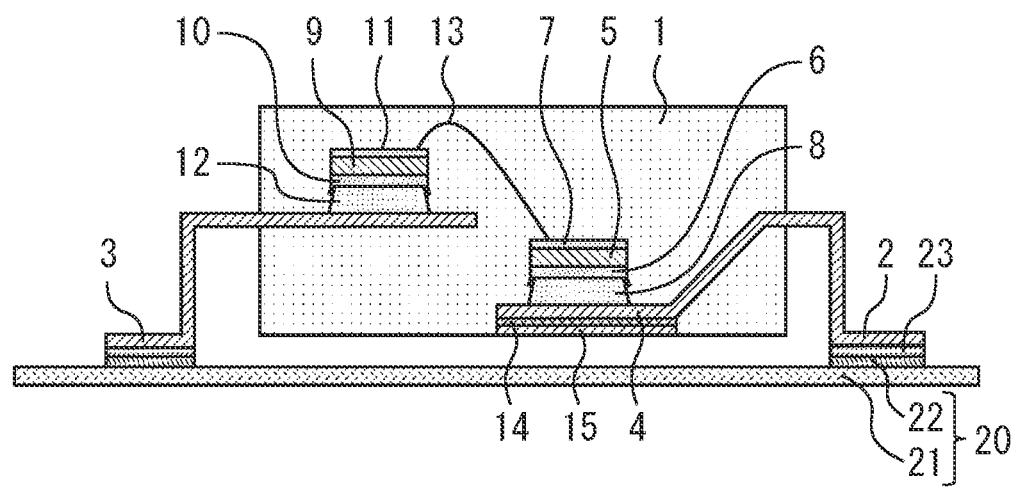
FIG. 6 is a cross-sectional view illustrating a state where the package according to the first embodiment is surface-mounted on an insulating substrate.

FIG. 6 is a cross-sectional view illustrating a state where the package according to the first embodiment is surface-mounted on an insulating substrate. An insulating substrate 20 includes an insulating material 21 and a metal wiring 22 provided on a front surface of the insulating material 21. A substrate bonding surface of the terminal 2 protruding from the sealing resin 1 is bonded to the metal wiring 22 by a bonding material 23 having a conductive property.

The remelting temperature of the Ag bonding material 8 containing 50 to 85% Ag is 960° C. On the other hand, the bonding material 23 is solder containing 95% lead, for example, and the melting temperature thereof is 300° C. Therefore, the melting temperature of the bonding material 23 is lower than the remelting temperature of the Ag bonding material 8.

After the die pad 4 and the back surface electrode 6 are bonded to each other by the Ag bonding material 8 and are sealed with resin, the terminals 2 and 3 protruding from the sealing resin 1 are bonded to the metal wiring 22 by the bonding material 23. The Ag bonding material 8 within the package is also exposed to a high temperature at the time of such reflow. A heating temperature in bonding the terminals 2 and 3 to the metal wiring 22 by the reflow is made lower than the remelting temperature of the Ag bonding material 8. As a result, the Ag bonding material can be prevented from being remelted. Since the Ag bonding material 8 is not remelted, the reliability of a product can be kept high. Therefore, in the surface-mounted semiconductor device, an advantage of applying the Ag bonding material 8 is large.

As described above, in the present embodiment, the thickness of the Ag bonding material 8 is larger than the height in the up-down direction of the metal burr 16 by 2 μm or more. This makes it possible to ensure a path through which voids generated by volatilization or shrinkage of solvent when the Ag paste 19 is sintered are to be released. Accordingly, the number of voids in the Ag bonding material 8 can be reduced. Therefore, heat dissipation can be improved, and a variation in heat dissipation can be reduced.

The result has been obtained that the number of voids tends to decrease when the thickness of the Ag bonding material 8 is larger than the height of the metal burr 16 by 2 μm or more and significantly decreases when the thickness of the Ag bonding material 8 is larger than the height of the metal burr 16 by 5 μm or more. Therefore, the thickness of the Ag bonding material 8 is preferably larger than the height of the metal burr 16 by 5 μm or more.

The height of the metal burr 16 is proportional to the thickness of the back surface electrode 6. As a result of conducting an experiment using the back surface electrode 6 in which an Al—Si layer, a Ti layer, an Ni layer, and an Au layer are stacked, the following relationship between the thickness of the back surface electrode 6 and the height of the metal burr 16 was obtained. The Al—Si layer is the ohmic electrode 6a having a good ohmic property, i.e., having a low contact resistance between itself and an Si/SiC substrate. The Au layer is the oxidation prevention electrode 6c, and the Ti layer and the Ni layer are each the adhesive layer 6b. The thickness of the Al—Si layer was fixed at 800 µm, to change a total thickness of the Au layer, the Ti layer, and the Ni layer. The following data describes a total thickness of the oxidation prevention electrode 6c and the adhesive layer 6b, excluding the ohmic electrode 6a, in a stacked structure of the back surface electrode 6.

TABLE 1

|  | total thickness of oxidation prevention electrode and adhesive layer | height of metal burr |
| --- | --- | --- |
| sample 1 | 850 µm | 13.16 µm |
| sample 2 | 500 µm | 11.17 µm |
| sample 3 | 150 µm | 6.05 µm |
| sample 4 | 100 µm | 5.05 µm |
| sample 5 | 50 µm | 4.35 µm |

It has been found that the metal burr 16 can be prevented from occurring when a total thickness of the back surface electrode 6 is reduced. The ohmic electrode 6a can also have a thickness of 100 µm or less, and can be omitted depending on selection of a material for the oxidation prevention electrode 6c. It has been confirmed that the metal burr 16 can also be suppressed when the ohmic electrode 6a is thinned, like when the total thickness of the oxidation prevention electrode 6c and the adhesive layer 6b is reduced.

It has been found that an area occupied by voids in the entire lower surface of the back surface electrode 6 can be reduced when the thickness of the back surface electrode 6 is set to 1650 µm (sample 1) or less. Therefore, the thickness of the back surface electrode 6 is desirably set to 1650 µm or less. The thickness of the back surface electrode 6 is more desirably 1000 µm or less and most desirably 100 µm or less. When the height of the metal burr 16 is reduced, the thickness of the Ag bonding material 8 can be reduced. Accordingly, a thermal resistance and costs can also be reduced.

The back surface electrode 6 may have a stacked structure of one layer of ohmic electrode 6a and one layer of oxidation prevention electrode 6c. Since an adhesive layer 6b such as a Ti layer or an Ni layer does not exist, the total thickness of the back surface electrode 6 can be suppressed. If the back surface electrode 6 has a stacked structure in which the ohmic electrode 6a is an Al—Si layer and the oxidation prevention electrode 6c is an Au layer, the total thickness thereof can be set to 100 µm or less.

The ohmic electrode 6a may be changed to a metal layer other than an Al—Si layer that can come into ohmic contact with an Si/SiC substrate. The oxidation prevention electrode 6c may be changed to a metal layer other than an Au layer oxidation and sulfidation measures of which can be taken, e.g., an Ag layer. The oxidation prevention electrode 6c that contacts the Ag bonding material 8 may be an Ag layer. As a result, adhesion and conductivity between the back surface electrode 6 and the Ag bonding material 8 can be improved. The ohmic electrode 6a may be an Ag alloy layer. This makes it possible to ensure an ohmic property between the semiconductor chip 5 and the back surface electrode 6.

If the oxidation prevention electrode 6c on an outermost surface of the back surface electrode 6 is an Au layer, oxidation and sulfidation of the back surface electrode 6 can be prevented, and electrical and mechanical bonding between the back surface electrode 6 and the die pad 4 can also be stably ensured.

The back surface electrode 6 may have a structure in which an Ag alloy layer, an Ag layer, and an Au layer are stacked from the semiconductor chip 5 side, or may have a structure in which an Ag alloy layer and an Au layer are stacked. As a result, the number of materials is small, and manufacturability is high, and the costs can be reduced. The number of voids can be reduced by reducing the thickness of the back surface electrode 6 and reducing the height of the metal burr 16. Since ohmic contact is obtained between an Ag alloy and Si, the number of Al—Si, Ti, and Ni layers can be reduced.

Second Embodiment

Figure 7:
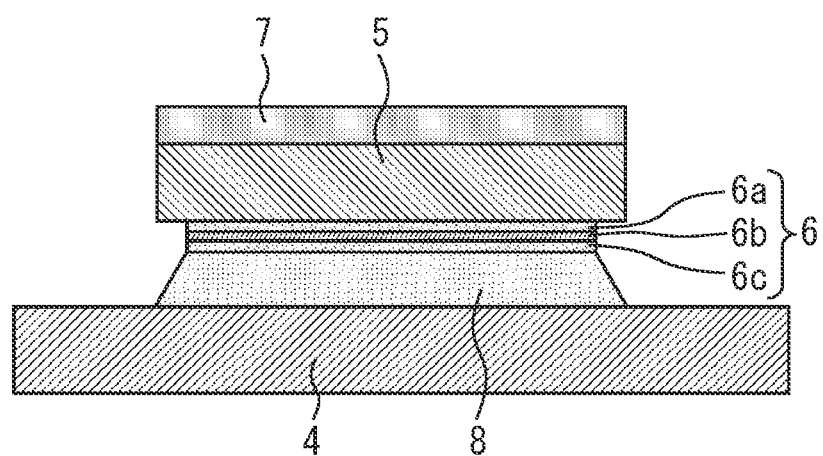
FIG. 7 is a cross-sectional view illustrating a mounting portion of a semiconductor chip in a semiconductor device according to a second embodiment in an enlarged manner.

FIG. 7 is a cross-sectional view illustrating a mounting portion of a semiconductor chip in a semiconductor device according to a second embodiment in an enlarged manner. An end portion of a back surface electrode 6 is arranged inside an end portion on a back surface of a semiconductor chip 5. Although respective end portions of only two sides of a rectangular power chip are illustrated In FIG. 7, an end portion of the back surface electrode 6 is also similarly arranged inside an end portion on the back surface of the semiconductor chip 5 in respective end portions of the remaining two sides of the rectangular power chip. A metal burr 16 does not exist in the back surface electrode 6. Other components are similar to those in the first embodiment.

Figure 8:
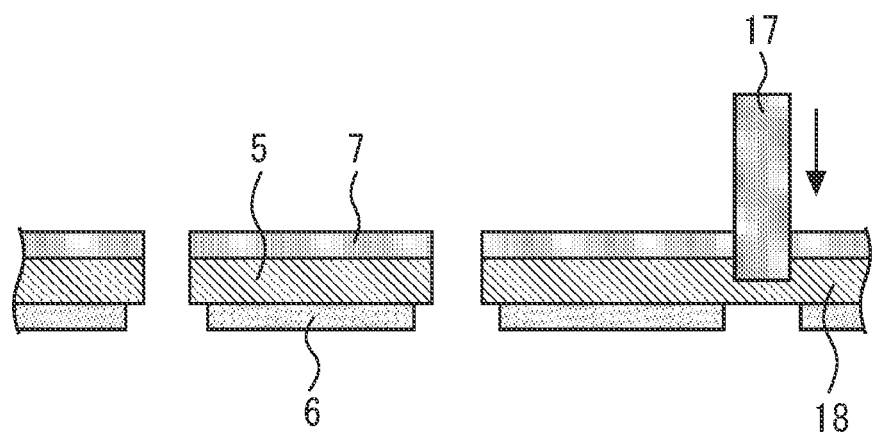
FIG. 8 is a cross-sectional view illustrating processes for manufacturing the semiconductor device according to the second embodiment.

FIG. 8 is a cross-sectional view illustrating processes for manufacturing the semiconductor device according to the second embodiment. When the back surface electrode 6 is formed in a semiconductor wafer 18, patterning is later performed such that the back surface electrode 6 is not formed at a position to be the end portion of the semiconductor chip 5. When the semiconductor wafer 18 is diced and is divided into semiconductor chips 5, the back surface electrode 6 is not diced. Accordingly, the metal burr 16 is not formed in the back surface electrode 6. This makes it possible to ensure a path through which voids generated by volatilization or shrinkage of solvent when an Ag paste 19 is sintered are to be released. Accordingly, the number of voids in the Ag bonding material 8 can be reduced. Therefore, heat dissipation can be improved, and a variation in heat dissipation can be reduced. Since the metal burr 16 does not exist, the thickness of an Ag bonding material 8 can be reduced. Accordingly, a thermal resistance and costs can also be reduced.

The semiconductor chip 5 is not limited to a semiconductor chip formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2021-175883, filed on Oct. 27, 2021 including specification, claims, drawings and summary, on which the convention priority of the present application is based, is incorporated herein by reference in its entirety.

The invention claimed is:

1. A semiconductor device comprising:
   a die pad having a conductive property;
   a semiconductor chip;
   a back surface electrode formed on a back surface of the semiconductor chip;
   an Ag bonding material containing 50 to 85% Ag and bonding the back surface electrode and the die pad;
   a terminal connected to the semiconductor chip; and
   sealing resin having an insulating property and covering the die pad, the semiconductor chip, the Ag bonding material, and a part of the terminal,
   wherein a distal end of the terminal protruding from the sealing resin includes a substrate bonding surface,
   a metal burr protrudes from a peripheral portion on a lower surface of the back surface electrode contacting the Ag bonding material, and
   a thickness of the Ag bonding material is larger than a height in an up-down direction of the metal burr by 2 μm or more.

2. The semiconductor device according to claim 1, wherein the thickness of the Ag bonding material is larger than the height in an up-down direction of the metal burr by 5 μm or more.

3. The semiconductor device according to claim 1, wherein a thickness of the back surface electrode excluding the metal burr is 1650 μm or less.

4. The semiconductor device according to claim 1, wherein the back surface electrode has a stacked structure of an ohmic electrode ohmic-bonded to the semiconductor chip and an oxidation prevention electrode contacting the Ag bonding material.

5. The semiconductor device according to claim 4, wherein the back surface electrode consists of one layer of the ohmic electrode and one layer of the oxidation prevention electrode.

6. The semiconductor device according to claim 4, wherein the ohmic electrode is made of Al—Si or Ag alloy.

7. The semiconductor device according to claim 4, wherein the oxidation prevention electrode is made of Au.

8. The semiconductor device according to claim 4, wherein the oxidation prevention electrode is made of Ag.

9. The semiconductor device according to claim 1, comprising an insulating substrate including an insulating material and a metal wiring provided on a front surface of the insulating material,
   wherein the substrate bonding surface of the terminal is bonded to the metal wiring by a bonding material having a conductive property, and
   melting temperature of the bonding material is lower than remelting temperature of the Ag bonding material.

10. The semiconductor device according to claim 1, wherein the semiconductor chip is formed of a wide-bandgap semiconductor.

11. A method for manufacturing a semiconductor device according to claim 1, comprising:
    applying an Ag paste onto the die pad;
    placing the semiconductor chip on the Ag paste; and
    heating the Ag paste to sinter-bond the die pad and the back surface electrode of the semiconductor chip to each other,
    wherein the Ag paste after sintering is the Ag bonding material, and
    a thickness of the Ag paste to be applied onto the die pad is set such that the thickness of the Ag bonding material after the sintering is larger than the height in the up-down direction of the metal burr 16 by 2 μm or more.

12. The method for manufacturing a semiconductor device according to claim 11, wherein viscosity of the Ag paste before sintering is 20 Pa·S or more.

13. A method for manufacturing a semiconductor device according to claim 9, comprising, after bonding the die pad and the back surface electrode by the Ag bonding material, bonding the substrate bonding surface of the terminal to the metal wiring by the bonding material,
    wherein a heating temperature in bonding the terminal to the metal wiring by reflow is lower than remelting temperature of the Ag bonding material.

* * * * *